(12) United States Patent
Cui et al.

(10) Patent No.: US 11,038,109 B2
(45) Date of Patent: Jun. 15, 2021

(54) METHOD FOR FABRICATING ORGANIC LIGHT-EMITTING DISPLAY PANEL AND DISPLAY DEVICE USING INK JET PRINTING TO FORM LIGHT-EMITING LAYER

(71) Applicant: BOE Technology Group Co., Ltd., Beijing (CN)

(72) Inventors: Ying Cui, Beijing (CN); Wenjun Hou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/490,109

(22) PCT Filed: Nov. 14, 2018

(86) PCT No.: PCT/CN2018/115484
§ 371 (c)(1),
(2) Date: Aug. 30, 2019

(87) PCT Pub. No.: WO2019/184387
PCT Pub. Date: Oct. 3, 2019

(65) Prior Publication Data
US 2020/0066989 A1 Feb. 27, 2020

(30) Foreign Application Priority Data

Mar. 28, 2018 (CN) .......................... 201810262225.2

(51) Int. Cl.
*H01L 51/00* (2006.01)
*H01L 51/56* (2006.01)
*H01L 27/32* (2006.01)

(52) U.S. Cl.
CPC ...... *H01L 51/0005* (2013.01); *H01L 27/3216* (2013.01); *H01L 51/0007* (2013.01); *H01L 51/56* (2013.01)

(58) Field of Classification Search
CPC ............. H01L 51/0005; H01L 27/3216; H01L 51/0007; H01L 51/56
See application file for complete search history.

(56) References Cited

U.S. PATENT DOCUMENTS

| 2012/0091441 A1* | 4/2012 | Matsushima ....... H01L 27/3211 257/40 |
| 2012/0091483 A1* | 4/2012 | Matsushima ....... H01L 27/3246 257/89 |

(Continued)

FOREIGN PATENT DOCUMENTS

| CN | 104465706 A | 3/2015 |
| CN | 104786656 A | 7/2015 |

(Continued)

OTHER PUBLICATIONS

Chinese Office Action for corresponding application 201810262225.2 dated Mar. 5, 2019.

*Primary Examiner* — Michael Jung
(74) *Attorney, Agent, or Firm* — Arent Fox LLP; Michael Fainberg

(57) ABSTRACT

The disclosure discloses an organic light-emitting display panel, a method for fabricating the same, and a display device, and the method for fabricating an organic light-emitting display panel includes: providing a substrate; and forming light-emitting layers sequentially in opening regions of sub-pixels in different colors, wherein at least one of sub-pixels other than a sub-pixel with a largest area is a first sub-pixel, and sub-pixels other than the first sub-pixel are second sub-pixels; and forming a light-emitting layer for the first sub-pixel includes: jetting a solvent for dissolving a (Continued)

light-emitting material in at least one of the second sub-pixels in which no light-emitting layer is formed, and jetting ink including the solvent, and a light-emitting material corresponding to the first sub-pixel in the first sub-pixel.

15 Claims, 4 Drawing Sheets

(56) References Cited

U.S. PATENT DOCUMENTS

| | | | |
|---|---|---|---|
| 2012/0097933 A1 | 4/2012 | Ando | |
| 2013/0285042 A1* | 10/2013 | Komatsu | H01L 51/5203 |
| | | | 257/40 |
| 2015/0280130 A1* | 10/2015 | Sago | H01L 51/5056 |
| | | | 257/99 |
| 2017/0036461 A1 | 2/2017 | Hu et al. | |
| 2017/0047381 A1* | 2/2017 | Takata | H01L 27/3246 |
| 2017/0069697 A1* | 3/2017 | Hashimoto | H01L 27/3246 |
| 2018/0033842 A1 | 2/2018 | Bae et al. | |
| 2018/0040821 A1* | 2/2018 | Hatakeyama | C09K 11/06 |
| 2018/0062078 A1* | 3/2018 | Watanabe | H01L 51/005 |
| 2018/0069178 A1* | 3/2018 | Oda | C09K 11/06 |

FOREIGN PATENT DOCUMENTS

| | | |
|---|---|---|
| CN | 107665905 A | 2/2018 |
| CN | 107732026 A | 2/2018 |
| CN | 108281474 A | 7/2018 |
| JP | 2012079631 A | 4/2012 |

* cited by examiner

METHOD FOR FABRICATING ORGANIC LIGHT-EMITTING DISPLAY PANEL AND DISPLAY DEVICE USING INK JET PRINTING TO FORM LIGHT-EMITING LAYER

This disclosure is a National Stage of International Application No. PCT/CN2018/115484, filed Nov. 14, 2018, which claims priority to Chinese Patent Application No. 201810262225.2, filed Mar. 28, 2018, both of which are hereby incorporated by reference in their entireties.

FIELD

The disclosure relates to the field of display technologies, and particularly to an organic light-emitting display panel, a method for fabricating the same, and a display device.

BACKGROUND

The ink-jet printing technology has the advantages of easy operations, a low cost, a simple process, easiness to implement a large size product, etc., so an organic light-emitting display panel has been fabricated through ink-jet printing in a number of applications. However, a solvent may be volatilized so rapidly that a non-uniform film may be formed.

SUMMARY

Embodiments of the disclosure provide a method for fabricating an organic light-emitting display panel, the method comprising:

providing a substrate with a plurality of sub-pixels arranged in an array, wherein areas of opening regions of sub-pixels in different colors are not exactly the same; and forming light-emitting layers sequentially in the opening regions of the sub-pixels in the different colors, wherein at least one of sub-pixels other than a sub-pixel with a largest area is a first sub-pixel, and sub-pixels other than the first sub-pixel are second sub-pixels; and forming a light-emitting layer for the first sub-pixel includes:

jetting a solvent for dissolving a light-emitting material in at least one of the second sub-pixels in which no light-emitting layer is formed; and jetting ink including the solvent, and a light-emitting material corresponding to the first sub-pixel in the first sub-pixel.

Optionally, in the method for fabricating the organic light-emitting display panel according to the embodiments of the disclosure, when the first sub-pixel includes only a sub-pixel with a smallest area, forming the light-emitting layer for the first sub-pixel includes:

jetting the solvent in at least one of the other sub-pixels, in which no light-emitting layer is formed, than the sub-pixel with the smallest area; and jetting the ink in the sub-pixel with the smallest area.

Optionally, in the method for fabricating the organic light-emitting display panel according to the embodiments of the disclosure, jetting the solvent in at least one of the other sub-pixels, in which no light-emitting layer is formed, than the sub-pixel with the smallest area includes:

jetting the solvent in the sub-pixel with the largest area, when no light-emitting layer is formed in the sub-pixel with the largest area.

Optionally, in the method for fabricating the organic light-emitting display panel according to the embodiments of the disclosure, jetting the solvent in at least one of the other sub-pixels, in which no light-emitting layer is formed, than the sub-pixel with the smallest area includes:

jetting the solvent in each of the second sub-pixels, when no light-emitting layer is formed in each of the second sub-pixels.

Optionally, in the method for fabricating the organic light-emitting display panel according to the embodiments of the disclosure, when the first sub-pixel includes all of the other sub-pixels than the sub-pixel with the largest area, forming the light-emitting layers for the first sub-pixels includes:

jetting the solvent in the sub-pixel with the largest area; and jetting, in first sub-pixels in different colors, with ink corresponding to the first sub-pixels sequentially.

Optionally, in the method for fabricating the organic light-emitting display panel according to the embodiments of the disclosure, when the first sub-pixel includes all of the other sub-pixels than the sub-pixel with the largest area, forming the light-emitting layer for the first sub-pixel includes:

jetting the solvent in the sub-pixel with the largest area; and jetting, in a first sub-pixel in any color, with ink corresponding to the first sub-pixel in any color.

Optionally, in the method for fabricating the organic light-emitting display panel according to the embodiments of the disclosure, after the ink including the solvent, and the light-emitting material corresponding to the first sub-pixel is jetted in the first sub-pixel, the method further includes:

drying the substrate in which the ink is jetted, to form a film.

Optionally, in the method for fabricating the organic light-emitting display panel according to the embodiments of the disclosure, after drying the substrate in which the ink is jetted, to form a film, the method further includes:

jetting, in a sub-pixel in which no ink is jetted, with corresponding ink.

Optionally, in the method for fabricating the organic light-emitting display panel according to the embodiments of the disclosure, the plurality of sub-pixels include a red sub-pixel, a green sub-pixel, and a blue sub-pixel, and an area of an opening of the blue sub-pixel is larger than an area of an opening of the red sub-pixel, and an area of an opening of the green sub-pixel, respectively.

Optionally, in the method for fabricating the organic light-emitting display panel according to the embodiments of the disclosure, ink jetted in the red sub-pixel, and ink jetted in the green sub-pixel includes the same solvent, and the same solvent is jetted in the opening region of the blue sub-pixel.

Optionally, in the method for fabricating the organic light-emitting display panel according to the embodiments of the disclosure, the same solvent is a main solvent of the ink jetted in the red sub-pixel, and a main solvent of the ink jetted in the green sub-pixel.

Embodiments of the disclosure further provide an organic light-emitting display panel which is fabricated using the method for fabricating an organic light-emitting display panel according to any one of the embodiments above of the disclosure.

Embodiments of the disclosure further provide a display device including the organic light-emitting display panel according to the embodiment above of the disclosure.

DETAILED DESCRIPTION OF THE EMBODIMENTS

Figure 1:
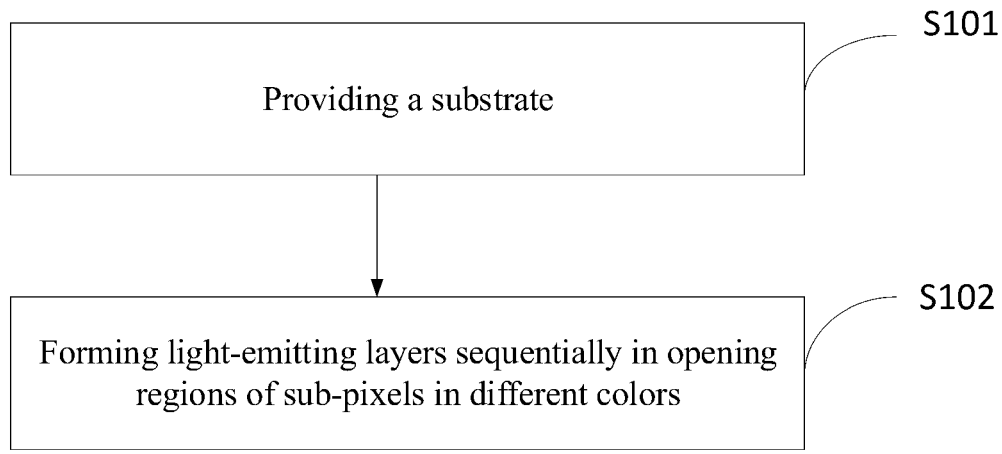
FIG. 1 is a first flow chart of a method for fabricating an organic light-emitting display panel according to embodiments of the disclosure.
Figure 2:
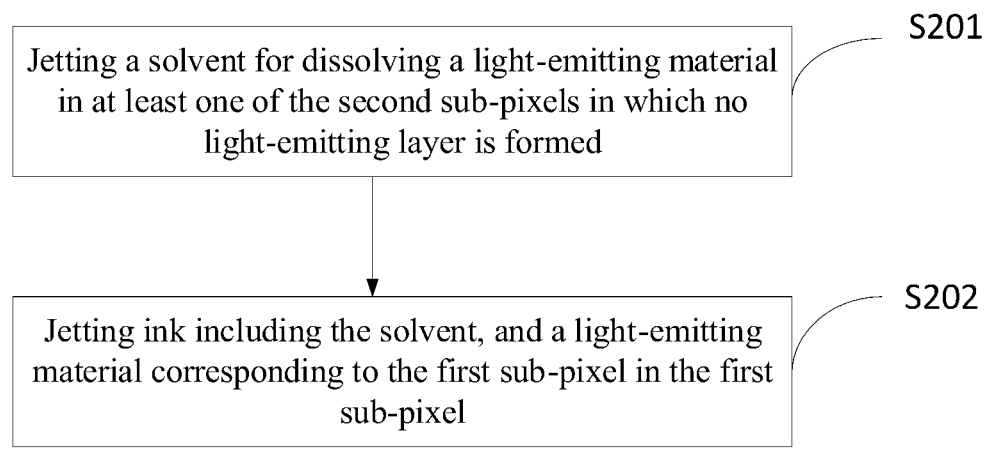
FIG. 2 is a flow chart in details of forming a light-emitting layer in the organic light-emitting display panel according to the embodiments of the disclosure.

Generally, a non-uniform light-emitting layer in an organic light-emitting display panel fabricated through ink-jet printing is formed in the related art because a solvent in a part of ink including a light-emitting material is volatilized rapidly during ink-jet printing. A light-emitting layer in the existing organic light-emitting display panel typically includes a red sub-pixel region, a green sub-pixel region, and a blue sub-pixel region, and the organic light-emitting display panel is typically fabricated through ink-jet printing by jetting corresponding ink including light-emitting materials, e.g., ink including a red light-emitting material, ink including a green light-emitting material, and ink including a blue light-emitting material, in respective sub-pixel regions, where the light-emitting efficiency and the service life of the blue light-emitting material are lower and shorter than those of the red and green light-emitting materials. Therefore, as illustrated in sub-figure (a) of FIG. 3, in order to improve the light-emitting efficiency and the service life of the organic light-emitting display panel as a whole, typically, areas of the red and green sub-pixel regions are designed slightly smaller, and an area of the blue sub-pixel region is designed slightly larger to thereby make up for the lower light-emitting efficiency and the shorter service life of the blue light-emitting material. In this case, when the organic light-emitting display panel is fabricated through ink-jet printing, volumes of the jetted ink including the red and green light-emitting materials are smaller in the smaller red and green sub-pixel regions, so the solvent in the ink is volatilized more rapidly, thus degrading the uniformity of formed films of the red and green light-emitting materials.

In view of the problem above, the embodiments of the disclosure provide a method for fabricating an organic light-emitting display panel, so as to significantly address the problem above by slowing down volatilization of the ink including the red and green light-emitting materials without changing the areas of the original sub-pixel regions.

The embodiments of the disclosure will be described below in details, and examples of the embodiments are illustrated in the drawings throughout which like or similar reference numerals refer to like or similar elements, or elements with like or similar functions. The embodiments to be described below with reference to the drawings are exemplary, and only intended to set forth the disclosure, but not to limit the disclosure thereto.

Hereupon, as illustrated in FIG. 1, a method for fabricating an organic light-emitting display panel according to the embodiments of the disclosure includes the following operations.

The operation S101 is to provide a substrate with a plurality of sub-pixels arranged in an array, where areas of opening regions of sub-pixels in different colors are not exactly the same.

Particularly, in the method for fabricating the organic light-emitting display panel according to the embodiments of the disclosure, the substrate will not be limited to any particular type, but can be selected by those skilled in the art as needed in reality. For example, the substrate can be a glass substrate in the embodiments of the disclosure. In the embodiments of the disclosure, opening regions of respective sub-pixels are defined by a pixel definition layer, where a material of the pixel definition layer will not be limited to any particular material, and for example, at least a part of a surface of the pixel definition layer can be made of a hydrophobic material. In the embodiments of the disclosure, the form of the pixel definition layer will not be limited to any particular form, for example, the pixel definition layer may include openings distributed in an array, and a plurality of sub-pixels can be formed on the substrate using the openings to thereby avoid a color crosstalk between different sub-pixels.

It shall be noted that, in the method for fabricating the organic light-emitting display panel according to the embodiments of the disclosure, the areas of the opening regions of sub-pixels in different colors are not exactly the same. As described above, in order to fabricate the organic light-emitting display panel through ink-jet printing, typically, corresponding light-emitting materials are jetted respectively in the respective sub-pixel regions, where there are different light-emitting efficiencies and the service lives of the respective light-emitting materials, so that the areas of the plurality of sub-pixel regions may not be exactly the same, where a sub-pixel region corresponding to a light-emitting material with a higher light-emitting efficiency and a longer service life may be set slightly smaller, and a sub-pixel region corresponding to a light-emitting material with a lower light-emitting efficiency and a shorter service life may be set slightly larger to thereby make up for the shortage of the light-emitting material with the lower light-emitting efficiency and the shorter service life so as to improve the light-emitting efficiency and the service life of an OLED display panel as a whole. In a particular embodiment of the disclosure, as illustrated in sub-figure (a) of FIG. 3, a pixel definition layer 200 defines a plurality of sub-pixel regions on a substrate (not illustrated), and the plurality of sub-pixel regions can include a red sub-pixel region R, a green sub-pixel region and a blue sub-pixel region B, where an area of the blue sub-pixel region B is larger than an area of the red sub-pixel region R and an area of the green sub-pixel region G In a particular embodiment of the disclosure, ink including a red light-emitting material, ink including a green light-emitting material, and ink including a blue light-emitting material can be jetted respectively in the respective sub-pixel regions, where the light-emitting efficiency and the service life of the blue light-emitting material are lower and shorter than those of the red and green light-emitting materials, so in order to improve the light-emitting efficiency and the service life of the organic light-emitting display panel as a whole, typically, the areas of the red and green sub-pixel regions are designed slightly smaller, and the area of the blue sub-pixel region is designed slightly larger to thereby make up for the lower light-emitting efficiency and the shorter service life of the blue light-emitting material. Further, the area of the red sub-pixel region may or may not be the same as the area of the green sub-pixel region.

The operation S102 is to form light-emitting layers sequentially in the opening regions of the sub-pixels in the different colors, where at least one of sub-pixels other than a sub-pixel with a largest area is a first sub-pixel, and sub-pixels other than the first sub-pixel are second sub-pixels.

Particularly, in the method for fabricating the organic light-emitting display panel according to the embodiments of the disclosure, the operation S102 particularly includes the following operations.

The operation S201 is to jet a solvent for dissolving a light-emitting material in at least one of the second sub-pixels in which no light-emitting layer is formed.

The operation S202 is to jet ink including the solvent, and a light-emitting material corresponding to the first sub-pixel in the first sub-pixel.

Particularly, in the method for fabricating the organic light-emitting display panel according to the embodiments of the disclosure, a solvent corresponding to a sub-pixel with a smaller area is jetted in an opening region of a sub-pixel with a larger area, so that when forming a light-emitting layer in the sub-pixel with the smaller area, the solvent jetted in the sub-pixel with the larger area can provide a solvent atmosphere for the sub-pixel with the smaller area so as to form a uniform film in the sub-pixel with the smaller area.

It shall be noted that, when the display panel includes sub-pixels in three colors, the sub-pixel with a larger area can be a sub-pixel with a largest area and/or a sub-pixel with a second largest area, and the sub-pixel with a smaller area can be a sub-pixel with a smallest area and/or a sub-pixel with a second smallest area; and no light-emitting layer shall be formed in a sub-pixel for providing a solvent atmosphere for the other sub-pixels, so as not to hinder a uniform film of the light-emitting layer from being formed in the sub-pixel.

Optionally, in the method for fabricating the organic light-emitting display panel according to the embodiments of the disclosure, when the first sub-pixel includes only a sub-pixel with a smallest area, forming a light-emitting layer for the first sub-pixel includes: jetting a solvent in at least one of the other sub-pixels, in which no light-emitting layer is formed, than the sub-pixel with the smallest area; and jetting ink in the sub-pixel with the smallest area.

Particularly, in the method for fabricating the organic light-emitting display panel according to the embodiments of the disclosure, for example, the organic light-emitting display panel includes three sub-pixels which are a red sub-pixel, a green sub-pixel, and a blue sub-pixel, where an area of the red sub-pixel is S1, an area of the green sub-pixel is S2, and an area of the blue sub-pixel is S3, where S1<S2<S3, so the first sub-pixel is the red sub-pixel, and the second sub-pixels corresponding thereto can be the green sub-pixel and the blue sub-pixel; and in a particular implementation, a solvent corresponding to the red sub-pixel can be jetted into the green sub-pixel and/or the blue sub-pixel to provide a solvent atmosphere for the red sub-pixel when a red light-emitting layer is being formed, to thereby slow down volatilization of the solvent in the red sub-pixel so as to form a uniform film of the light-emitting layer in the red sub-pixel.

Figure 3:
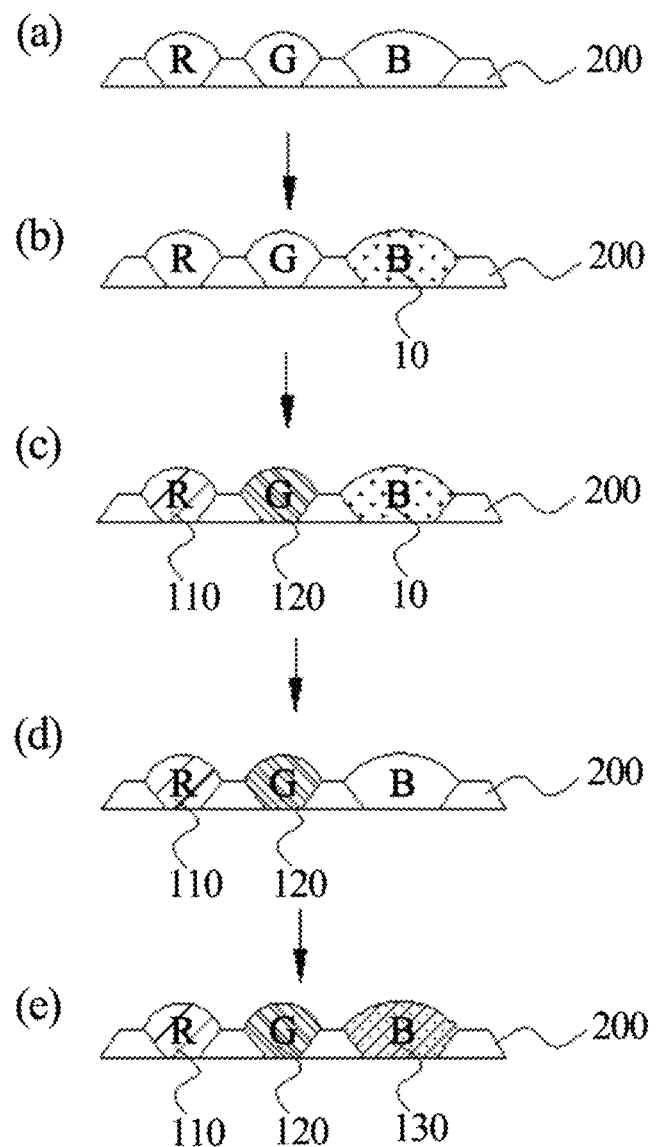
FIG. 3 is a schematic structural diagram of the organic light-emitting display panel fabricated according to the embodiments of the disclosure.

As illustrated in sub-figure (b) of FIG. 3, for example, a solvent 10 for ink including the red and green light-emitting materials can be jetted in advance in the blue sub-pixel region B, so that the jetted solvent 10 can provide a solvent atmosphere for subsequent volatilization of the ink including the red and green light-emitting materials, to thereby slow down volatilization of the ink including the red and green light-emitting materials so as to improve the uniform of films to be formed in the red and green sub-pixel regions. In some embodiments of the disclosure, when the area of the red sub-pixel region is larger than the area of the green sub-pixel region, alternatively a solvent can be jetted in advance in the blue sub-pixel region and the red sub-pixel region so that the jetted solvent can provide a solvent atmosphere for subsequent volatilization of ink including the green light-emitting material to thereby improve the uniform of a film to be formed in the green sub-pixel region. Alike, when the area of the green sub-pixel region is larger than the area of the red sub-pixel region, alternatively a solvent can be jetted in advance in the blue sub-pixel region and the green sub-pixel region so that the jetted solvent can provide a solvent atmosphere for subsequent volatilization of ink including the red light-emitting material to thereby improve the uniform of a film to be formed in the red sub-pixel region.

It shall be noted that, as an area of a sub-pixel region is smaller, a solvent will be volatilized more rapidly, and a film will be formed less uniformly, so there will be the least uniformity of a film formed in the sub-pixel region with the smallest area throughout an OLED device, thus significantly degrading the display quality of the OELD device as a whole. In some other embodiments of the disclosure, a solvent can be jetted in the other sub-pixel regions than the sub-pixel region with the smallest area, so that a solvent volatilization atmosphere as favorable as possible can be provided for ink in the sub-pixel region with the smallest area to thereby improve the uniformity of a film to be formed in the sub-pixel region with the smallest area so as to improve the display quality of the OLED device as a whole. In the embodiments of the disclosure, the solvent above will not be limited to any particular type, but can include a single solvent or a mixed solvent, and can be selected by those skilled in the art as needed in reality.

Particularly, in the method for fabricating the organic light-emitting display panel according to the embodiments of the disclosure, ink including a light-emitting material is jetted on the above provided substrate so that a light-emitting layer can be formed based upon a pixel definition layer. In the embodiments of the disclosure, the ink includes the light-emitting material, and a solvent for dissolving the light-emitting material. After the ink is subsequently dried, the solvent in the ink is volatilized, so the light-emitting layer can be formed of the remaining light-emitting material. In the embodiments of the disclosure, the types of the light-emitting material, and the solvent for dissolving the light-emitting material will not be limited to any particular types, but can be selected by those skilled in the art as needed in reality.

In the embodiments of the disclosure, components of the ink jetted in the red sub-pixel region (i.e., ink 110 including the red light-emitting material), and the ink jetted in the green sub-pixel region (i.e., ink 120 including the green light-emitting material) will not be limited to any particular components, but can be selected by those skilled in the art as needed in reality.

Optionally, in the method for fabricating the organic light-emitting display panel according to the embodiments of the disclosure, jetting the solvent in at least one of the other sub-pixels, in which no light-emitting layer is formed, than the sub-pixel with the smallest area includes: when no light-emitting layer is formed in the sub-pixel with the largest area, jetting the solvent in the sub-pixel with the largest area.

Particularly, in the method for fabricating the organic light-emitting display panel according to the embodiments of the disclosure, for example, the organic light-emitting display panel includes three sub-pixels which are a red sub-pixel, a green sub-pixel, and a blue sub-pixel, where an area of the red sub-pixel is S1, an area of the green sub-pixel is S2, and an area of the blue sub-pixel is S3, where S1<S2<S3. When the red sub-pixel is the first sub-pixel, and no light-emitting layer is formed in the blue sub-pixel with the largest area, an abundant solvent atmosphere can be provided by the blue sub-pixel with the largest area for forming a light-emitting layer corresponding to the red sub-pixel, so firstly a solvent corresponding to the red sub-pixel is jetted in the blue sub-pixel to thereby provide a solvent atmosphere for the red sub-pixel so as to guarantee the uniformity of a film of the light-emitting layer to be formed in the red sub-pixel.

Optionally, in the method for fabricating the organic light-emitting display panel according to the embodiments of the disclosure, jetting the solvent in at least one of the other sub-pixels, in which no light-emitting layer is formed, than the sub-pixel with the smallest area includes: when no light-emitting layer is formed in each second sub-pixel, jetting the solvent in each second sub-pixel.

Particularly, in the method for fabricating the organic light-emitting display panel according to the embodiments of the disclosure, for example, the organic light-emitting display panel includes three sub-pixels which are a red sub-pixel, a green sub-pixel, and a blue sub-pixel, where an area of the red sub-pixel is S1, an area of the green sub-pixel is S2, and an area of the blue sub-pixel is S3, where S1<S2<S3. When no corresponding light-emitting layer is formed in each of the green sub-pixel and the blue sub-pixel, a solvent corresponding to the red sub-pixel is jetted in each of the green sub-pixel and the blue sub-pixel to provide an abundant solvent atmosphere for forming a light-emitting layer corresponding to the red sub-pixel.

Optionally, in the method for fabricating the organic light-emitting display panel according to the embodiments of the disclosure, when the first sub-pixel includes all the other sub-pixels than the sub-pixel with the largest area, forming a light-emitting layer for the first sub-pixel includes: jetting a solvent in the sub-pixel with the largest area; and jetting, in first sub-pixels in different colors, with ink corresponding to the first sub-pixels sequentially.

Particularly, in the method for fabricating the organic light-emitting display panel according to the embodiments of the disclosure, for example, the organic light-emitting display panel includes three sub-pixels which are a red sub-pixel, a green sub-pixel, and a blue sub-pixel, where an area of the red sub-pixel is S1, an area of the green sub-pixel is S2, and an area of the blue sub-pixel is S3, where S1<S2<S3. When the first sub-pixel includes the red sub-pixel and the green sub-pixel, the second sub-pixel is the blue sub-pixel, and in order to form a red light-emitting layer, a solvent corresponding to the red sub-pixel is jetted in the blue sub-pixel; and in order to form a light-emitting layer in the green sub-pixel, a solvent corresponding to the green sub-pixel is jetted in the blue sub-pixel, where ink corresponding to the sub-pixel regions in the different colors is jetted respectively in the sub-pixel regions.

Of course, as illustrated in sub-figure (c) of FIG. 3, alternatively, the sub-pixel region with the largest area is the blue sub-pixel region B, and the area of the red sub-pixel region R is the same as the area of the green sub-pixel region so after the solvents corresponding to the red sub-pixel region R and the green sub-pixel region G are jetted in the blue sub-pixel region B, the ink 110 including the corresponding light-emitting material and solvent is jetted in the red sub-pixel region R, and then the ink 120 including the corresponding light-emitting material and solvent is jetted in the green sub-pixel region G so there are solvent atmospheres provided in advance for the ink 110 including the red light-emitting material, and the ink 120 including the green light-emitting material from the beginning of printing, thus slowing down volatilization thereof, and forming their films uniformly. Of course, alternately, firstly the ink 120 can be jetted in the green sub-pixel region G and then the ink 110 can be jetted in the red sub-pixel region R, although the embodiments of the disclosure will not be limited thereto.

Optionally, in the method for fabricating the organic light-emitting display panel according to the embodiments of the disclosure, when the first sub-pixel includes all the other sub-pixels than the sub-pixel with the largest area, forming a light-emitting layer for the first sub-pixel includes: jetting a solvent in the sub-pixel with the largest area; and jetting, in a first sub-pixel in any color, with ink corresponding to the first sub-pixel in any color.

Particularly, in the method for fabricating the organic light-emitting display panel according to the embodiments of the disclosure, for example, the organic light-emitting display panel includes three sub-pixels which are a red sub-pixel, a green sub-pixel, and a blue sub-pixel, where an area of the red sub-pixel is S1, an area of the green sub-pixel is S2, and an area of the blue sub-pixel is S3, where S1<S2<S3. When the first sub-pixel includes the red sub-pixel and the green sub-pixel, the second sub-pixel is the blue sub-pixel, a main solvent common to the ink of the red sub-pixel and the green sub-pixel can be jetted in the blue sub-pixel, and a solvent atmosphere can be provided for both the red sub-pixel and the green sub-pixel, so a corresponding ink can be jetted in a sub-pixel in either of the colors among the red sub-pixel and the blue sub-pixel to thereby improve the uniformity of a film of a light-emitting layer to be formed in the sub-pixel in the corresponding color.

Optionally, in the method for fabricating the organic light-emitting display panel according to the embodiments of the disclosure, after the ink including the solvent, and the light-emitting material corresponding to the first sub-pixel is jetted in the first sub-pixel, the method further includes the operation of: drying the substrate in which the ink is jetted, to form a film.

Particularly, in the method for fabricating the organic light-emitting display panel according to the embodiments of the disclosure, the substrate in which the solvent and the ink above is jetted is dried to form a film. In the embodiments of the disclosure, a uniform film of a light-emitting layer can be formed through drying, and all the solvent jetted in advance in a sub-pixel region with a larger area can be volatilized so that a corresponding light-emitting material is subsequently jetted in the sub-pixel region with the larger area. In a particular embodiment of the disclosure, the substrate in which the solvent 110 of the ink of the light-emitting layer, the ink 110 including the red light-emitting material, and the ink 120 including the green light-emitting material are jetted can be dried to form uniform films of the red light-emitting layer and the green light-emitting layer. Furthermore, as illustrated in sub-figure (d) of FIG. 3, all the solvent jetted in advance in the blue sub-pixel region can be volatilized through the drying and filming process so that a corresponding light-emitting material is subsequently jetted in the blue sub-pixel region. Since ink in a sub-pixel region with a smaller area (the red sub-pixel region and the green sub-pixel region as illustrated above) is volatilized more rapidly so that apparently a film is not formed uniformly, firstly a light-emitting layer can be formed in the sub-pixel region with the smaller area, that is, the operation of jetting and drying the light-emitting material in the sub-pixel region with the smaller area is performed before the operation of jetting and drying the light-emitting material in the sub-pixel region with the larger area, to thereby further improve the flatness of the light-emitting layer in the sub-pixel region with the smaller area.

Optionally, in the method for fabricating the organic light-emitting display panel according to the embodiments of the disclosure, after the substrate is dried to form a film, the method further includes: jetting, in a sub-pixel in which no ink is jetted, with corresponding ink.

Particularly, in the method for fabricating the organic light-emitting display panel according to the embodiments of the disclosure, jetting, in the sub-pixel in which no ink is jetted, with corresponding ink includes: if the area of the blue sub-pixel region is the largest, the area of the green sub-pixel region is the second largest, and the area of the red sub-pixel region is the smallest; and the solvent corresponding to the red sub-pixel is jetted in the blue sub-pixel region and the green sub-pixel region, and the ink is only jetted in the red sub-pixel region, then jetting corresponding ink respectively in the blue sub-pixel region and the green sub-pixel region after the substrate is dried to form a film. If the sub-pixel region with the largest area is the blue sub-pixel region B, and the area of the red sub-pixel region R is equal to the area of the green sub-pixel region G as illustrated in sub-figure (e) of FIG. 3, then the solvent will be only jetted in the blue sub-pixel region B, and the corresponding ink will be jetted in the green sub-pixel region G and the red sub-pixel region R; and after the substrate is dried to form a film, ink 130 including a blue light-emitting material may be jetted in the blue sub-pixel region B so that a blue light-emitting layer is subsequently formed to thereby form the light-emitting layers of an OLED display panel. It shall be noted that, the area of the blue sub-pixel region B is larger, and there is a larger volume of the ink 130 including the blue light-emitting material jetted in the blue sub-pixel region B, so there is a larger volume of the jetted ink 130 including the blue light-emitting material, and the solvent is volatilized more slowly, thus resulting in higher formed film uniformity without providing any solvent atmosphere in advance.

Optionally, in the method for fabricating the organic light-emitting display panel according to the embodiments of the disclosure, the plurality of sub-pixels include a red sub-pixel, a green sub-pixel, and a blue sub-pixel, and an area of an opening of the blue sub-pixel is larger than an area of an opening of the red sub-pixel, and an area of an opening of the green sub-pixel, respectively.

Particularly, in the method for fabricating the organic light-emitting display panel according to the embodiments of the disclosure, since the light-emitting efficiency and the service life of the light-emitting material corresponding to the blue sub-pixel are lower and shorter than those of the light-emitting materials of the red sub-pixel and the green sub-pixel, the area of the blue sub-pixel can be made larger than the areas of the red sub-pixel and the green sub-pixel to thereby guarantee uniform light-emitting efficiencies and service lives of the sub-pixels in respective colors in the display panel so as to improve the display quality.

Optionally, in the method for fabricating the organic light-emitting display panel according to the embodiments of the disclosure, ink jetted in the red sub-pixel, and ink jetted in the green sub-pixel includes the same solvent, and the same solvent is jetted in an opening region of the blue sub-pixel.

Optionally, in the method for fabricating the organic light-emitting display panel according to the embodiments of the disclosure, the same solvent is a main solvent of the ink in the red sub-pixel, and a main solvent of the ink in the green sub-pixel.

Particularly, in the method for fabricating the organic light-emitting display panel according to the embodiments of the disclosure, in order to further provide the same drying atmosphere for the ink jetted in the red and green sub-pixel regions, and to lower a cost of preparing the ink for forming the light-emitting layers, the ink jetted in the red and green sub-pixel regions can adopt the same solvent. The solvent for the ink 110 including the red light-emitting material and the ink 120 including the green light-emitting material can be a single solvent or a mixed solvent. It shall be noted that, the "same solvent" here shall be broadly interpreted, that is, when both of the ink above includes a single solvent, their solvents may be totally the same; and when one of them includes a single solvent, and the other includes a mixed solvent, their solvents may be partially the same, and for example, the solvent with the highest content among the mixed solvent may be the same as the single solvent in the jetted ink in the other color. In a particular embodiment of the disclosure, when both of the ink above includes a mixed solvent, there may be the same main solvent among the solvents in the ink 110 including the red light-emitting material, and the ink 120 including the green light-emitting material. It shall be noted that, the term "main solvent" refers to a component with the highest content among a mixed solvent. Accordingly, a solvent volatilization atmosphere can be provided for the red and green light-emitting materials simply by jetting the solvent once.

Those skilled in the art can appreciate that the number of light-emitting layers above with a smaller area (e.g., the red and green light-emitting layers), and their colors will not be limited to any particular number and colors, and the embodiments above are only intended to set forth the disclosure, but not to limit the disclosure thereto.

Figure 4:
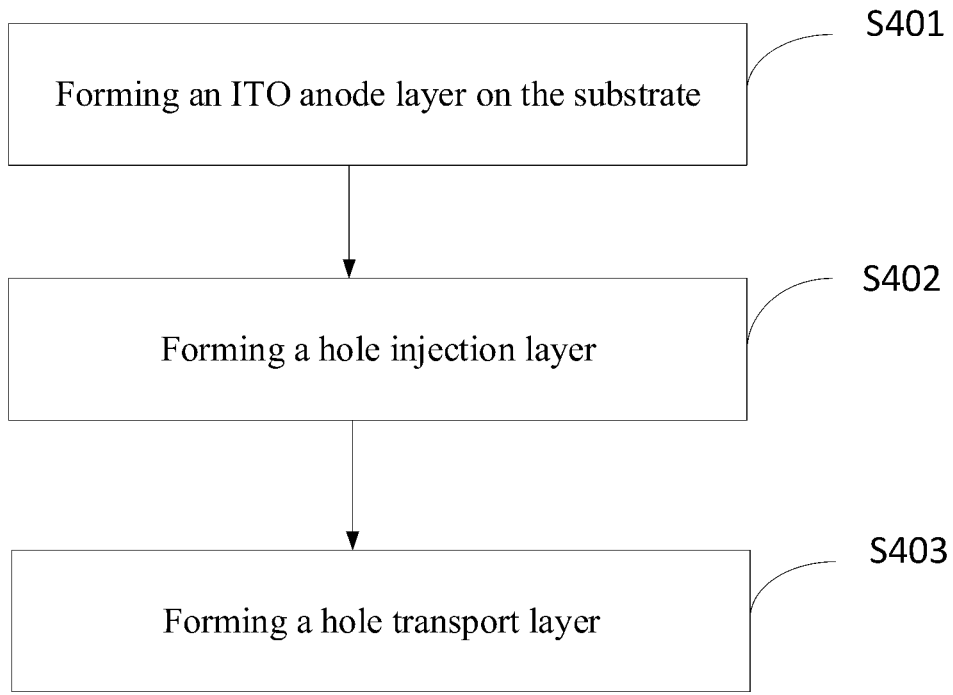
FIG. 4 is a second flow chart of the method for fabricating the organic light-emitting display panel according to the embodiments of the disclosure.

In addition to forming the light-emitting layers corresponding to the respective sub-pixels as described above, as illustrated in FIG. 4, the method for fabricating the organic light-emitting display panel according to the embodiments of the disclosure further includes the following operations.

The operation S401 is to form an ITO anode layer on the substrate.

In this operation, the ITO anode layer is formed on the substrate. In the embodiments of the disclosure, the thickness of the ITO anode layer and its formation process will not be limited to any particular thickness and formation process, but can be selected by those skilled in the art as needed.

The operation S402 is to form a hole injection layer.

In this operation, the hole injection layer is formed on a side of the ITO anode layer away from the substrate. In the embodiments of the disclosure, the material of the hole injection layer and its formation process will not be limited to any particular thickness and formation process. Particularly, a hole injection layer material can be jetted on the side of the ITO anode layer away from the substrate, and thereafter dried to form a film, baked, etc., to thereby form the hole injection layer.

The operation S403 is to form a hole transport layer.

In this operation, the hole transport layer is formed. In the embodiments of the disclosure, the material of the hole transport layer and its formation process will not be limited to any particular thickness and formation process. Particularly, a hole transport layer material can be jetted on a side of the hole injection layer away from the ITO anode layer, and thereafter dried to form a film, baked, etc., to thereby form the hole transport layer.

Figure 5:
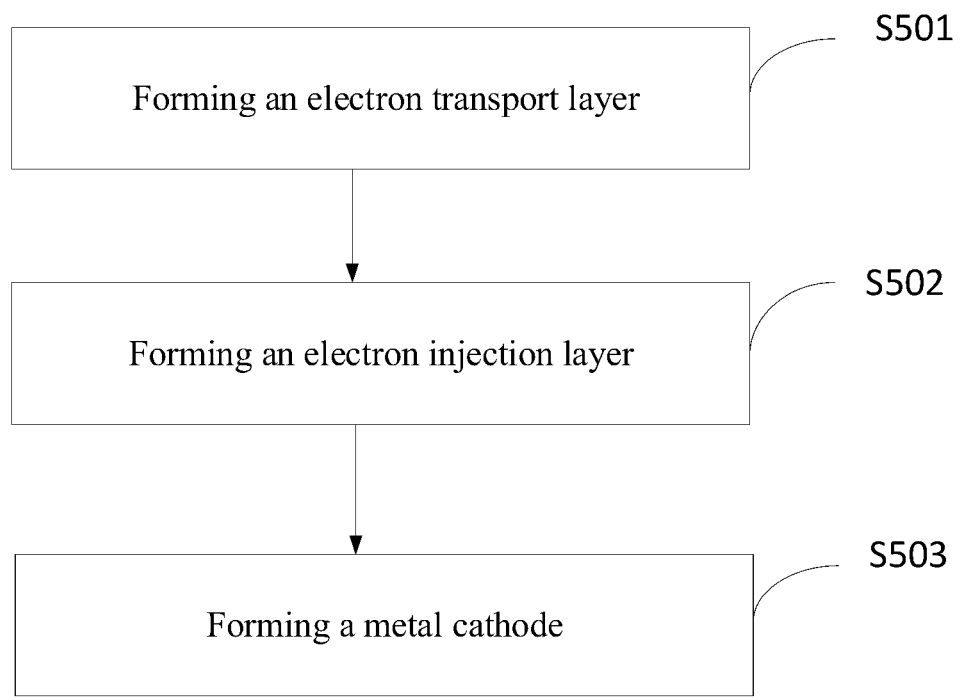
FIG. 5 is a third flow chart of the method for fabricating the organic light-emitting display panel according to the embodiments of the disclosure.

In the embodiments of the disclosure, as illustrated in FIG. 5, after the light-emitting layers are formed, the method can further include the following operations.

The operation S501 is to form an electron transport layer.

In this operation, the electron transport layer is formed on a side of the light-emitting layers away from the hole transport layer. In the embodiments of the disclosure, the material of the electron transport layer, and its formation process will not be limited to any particular material and formation process. Particularly, the electron transport layer can be formed on the side of the light-emitting layers away from the hole transport layer through vapor deposition.

The operation S502 is to form an electron injection layer.

In this operation, the electron injection layers is formed on a side of the electron transport layer away from the light-emitting layers. In the embodiments of the disclosure, the material of the electron injection layer and its formation process will not be limited to any particular material and formation process. Particularly, the electron injection layer can be formed on the side of the electron transport layer away from the light-emitting layers through vapor deposition.

The operation S503 is to form a metal cathode.

In this operation, the metal cathode is formed on a side of the electron injection layer away from the electron transport layer. In the embodiments of the disclosure, the material of the metal cathode and its formation process will not be limited to any particular material and formation process. Particularly, the metal cathode can be formed on the side of the electron injection layer away from the electron transport layer through vapor deposition.

In the embodiments of the disclosure, after the operation above of forming the metal cathode, the method can further include the operation of encapsulating the components so that the organic light-emitting display panel is fabricated.

In another aspect of the disclosure, the embodiments of the disclosure further provide an organic light-emitting display panel. The organic light-emitting display panel according to the embodiments of the disclosure can be fabricated using the method above. Accordingly, the organic light-emitting display panel includes all the features and advantages of an organic light-emitting display panel fabricated using the method above for fabricating an organic light-emitting display panel, so a repeated description thereof will be omitted here.

Figure 6:
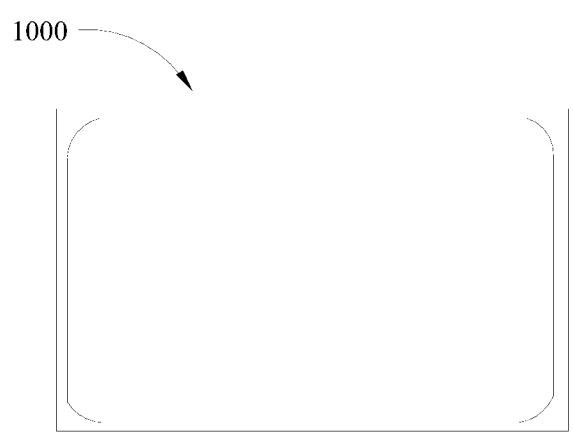
FIG. 6 is a schematic structural diagram of a display device according to the embodiments of the disclosure.

In another aspect of the disclosure, the embodiments of the disclosure further provide a display device. In the embodiments of the disclosure, as illustrated in FIG. 6, the display device 1000 can include the organic light-emitting display panel above. Accordingly, the display device includes all the features and advantages of the organic light-emitting display panel above, so a repeated description thereof will be omitted here.

In the organic light-emitting display panel, the method for fabricating the same, and the display device according to the embodiments of the disclosure, the method for fabricating an organic light-emitting display panel includes: providing a substrate with a plurality of sub-pixels arranged in an array, where areas of opening regions of sub-pixels in different colors are not exactly the same; and forming light-emitting layers sequentially in the opening regions of the sub-pixels in the different colors, where at least one of sub-pixels other than a sub-pixel with a largest area is a first sub-pixel, and sub-pixels other than the first sub-pixel are second sub-pixels; and forming a light-emitting layer for a first sub-pixel includes: jetting a solvent for dissolving a light-emitting material in at least one of the second sub-pixels in which no light-emitting layer is formed, and jetting ink including the solvent, and a light-emitting material corresponding to the first sub-pixel in the first sub-pixel.

With this method, volatilization of the ink being jetted in the other sub-pixel regions with a smaller area can be slowed down to thereby improve the uniformity of a film to be formed in the other sub-pixel regions with the smaller area, so as to improve the display quality of an OLED display panel.

In the description of the invention, the terms "up", "down", etc., indicate oriented or positional relationships which are based upon oriented or positional relationships illustrated in the drawings, and they are merely intended to facilitate the description of the disclosure, but not to require that the disclosure be constructed and operating in particular orientations, so they shall not be constructed as limiting the disclosure.

In the description of the disclosure, reference to the terms "an embodiment", "another embodiment", etc., refers to that particular features, structures, materials, or characteristics described in connection with the embodiment is included in at least one embodiment of the disclosure. In the disclosure, any schematic expression of the terms above may not refer to the same embodiment or example. Furthermore, the particular features, structures, materials, or characteristics as described can be combined as appropriate in any one or more embodiments or examples. Moreover, the different embodiments or examples described in the disclosure, and the features in the different embodiments or examples can be combined with each other by those skilled in the art unless they conflict with each other.

Evidently those skilled in the art can make various modifications and variations to the invention without departing from the spirit and scope of the invention. Thus, the invention is also intended to encompass these modifications and variations thereto so long as the modifications and variations come into the scope of the claims appended to the invention and their equivalents.

The invention claimed is:

1. A method for fabricating an organic light-emitting display panel, the method comprising:
   providing a substrate with a plurality of sub-pixels arranged in an array, wherein areas of opening regions of sub-pixels in different colors are not exactly the same; and
   forming light-emitting layers sequentially in the opening regions of the sub-pixels in the different colors, wherein at least one of sub-pixels other than a sub-pixel with a largest area is a first sub-pixel, and sub-pixels other than the first sub-pixel are second sub-pixels;
   wherein forming a light-emitting layer for the first sub-pixel comprises:
   jetting a solvent for dissolving a light-emitting material in at least one of the second sub-pixels in which no light-emitting layer is formed; and
   jetting ink comprising the solvent, and a light-emitting material corresponding to the first sub-pixel in the first sub-pixel;

wherein after the ink comprising the solvent, and the light-emitting material corresponding to the first sub-pixel is jetted in the first sub-pixel, the method further comprises:

drying the substrate in which the ink is jetted, to form a film; and wherein after drying the substrate in which the ink is jetted, to form a film, the method further comprises:

jetting, in a sub-pixel in which no ink is jetted, with corresponding ink.

2. The method according to claim 1, wherein when the first sub-pixel comprises only a sub-pixel with a smallest area, forming the light-emitting layer for the first sub-pixel comprises:

jetting the solvent in at least one of the other sub-pixels, in which no light-emitting layer is formed, than the sub-pixel with the smallest area; and jetting the ink in the sub-pixel with the smallest area.

3. The method according to claim 2, wherein jetting the solvent in at least one of the other sub-pixels, in which no light-emitting layer is formed, than the sub-pixel with the smallest area comprises:

jetting the solvent in the sub-pixel with the largest area, when no light-emitting layer is formed in the sub-pixel with the largest area.

4. The method according to claim 2, wherein jetting the solvent in at least one of the other sub-pixels, in which no light-emitting layer is formed, than the sub-pixel with the smallest area comprises:

jetting the solvent in each of the second sub-pixels, when no light-emitting layer is formed in each of the second sub-pixels.

5. The method according to claim 2, wherein after the ink comprising the solvent, and the light-emitting material corresponding to the first sub-pixel is jetted in the first sub-pixel, the method further comprises:

drying the substrate in which the ink is jetted, to form a film.

6. The method according to claim 2, wherein the plurality of sub-pixels comprise a red sub-pixel, a green sub-pixel, and a blue sub-pixel, and an area of an opening of the blue sub-pixel is larger than an area of an opening of the red sub-pixel, and an area of an opening of the green sub-pixel, respectively.

7. The method according to claim 1, wherein when the first sub-pixel comprises all of the other sub-pixels than the sub-pixel with the largest area, forming the light-emitting layer for the first sub-pixel comprises:

jetting the solvent in the sub-pixel with the largest area; and jetting, in first sub-pixels in different colors, with ink corresponding to the first sub-pixels sequentially.

8. The method according to claim 7, wherein after the ink comprising the solvent, and the light-emitting material corresponding to the first sub-pixel is jetted in the first sub-pixel, the method further comprises:

drying the substrate in which the ink is jetted, to form a film.

9. The method according to claim 7, wherein the plurality of sub-pixels comprise a red sub-pixel, a green sub-pixel, and a blue sub-pixel, and an area of an opening of the blue sub-pixel is larger than an area of an opening of the red sub-pixel, and an area of an opening of the green sub-pixel, respectively.

10. The method according to claim 1, wherein when the first sub-pixel comprises all of the other sub-pixels than the sub-pixel with the largest area, forming the light-emitting layer for the first sub-pixel comprises:

jetting the solvent in the sub-pixel with the largest area; and jetting, in a first sub-pixel in any color, with ink corresponding to the first sub-pixel in any color.

11. The method according to claim 10, wherein after the ink comprising the solvent, and the light-emitting material corresponding to the first sub-pixel is jetted in the first sub-pixel, the method further comprises:

drying the substrate in which the ink is jetted, to form a film.

12. The method according to claim 10, wherein the plurality of sub-pixels comprise a red sub-pixel, a green sub-pixel, and a blue sub-pixel, and an area of an opening of the blue sub-pixel is larger than an area of an opening of the red sub-pixel, and an area of an opening of the green sub-pixel, respectively.

13. The method according to claim 1, wherein the plurality of sub-pixels comprise a red sub-pixel, a green sub-pixel, and a blue sub-pixel, and an area of an opening of the blue sub-pixel is larger than an area of an opening of the red sub-pixel, and an area of an opening of the green sub-pixel, respectively.

14. The method according to claim 13, wherein ink jetted in the red sub-pixel, and ink jetted in the green sub-pixel comprises a same solvent, and the same solvent is jetted in the opening region of the blue sub-pixel.

15. The method according to claim 14, wherein the same solvent is a main solvent of the ink jetted in the red sub-pixel, and a main solvent of the ink jetted in the green sub-pixel.

* * * * *